(12) United States Patent
Negishi et al.

(10) Patent No.: US 12,207,505 B2
(45) Date of Patent: *Jan. 21, 2025

(54) DISPLAY UNIT AND ELECTRONIC APPARATUS

(71) Applicant: Sony Group Corporation, Tokyo (JP)

(72) Inventors: Eisuke Negishi, Tokyo (JP); Shinichi Teraguchi, Kanagawa (JP); Shuji Kudo, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/394,360

(22) Filed: Dec. 22, 2023

(65) Prior Publication Data

US 2024/0224627 A1 Jul. 4, 2024

Related U.S. Application Data

(63) Continuation of application No. 18/296,775, filed on Apr. 6, 2023, now Pat. No. 11,937,468, which is a
(Continued)

(30) Foreign Application Priority Data

Dec. 27, 2013 (JP) .................. 2013-272926

(51) Int. Cl.
*H10K 59/126* (2023.01)
*H10K 50/82* (2023.01)
(Continued)

(52) U.S. Cl.
CPC .......... *H10K 59/126* (2023.02); *H10K 50/82* (2023.02); *H10K 50/841* (2023.02);
(Continued)

(58) Field of Classification Search
None
See application file for complete search history.

(56) References Cited

U.S. PATENT DOCUMENTS 6,445,005 B1 9/2002 Yamazaki
7,745,992 B2 6/2010 Ko
(Continued)

FOREIGN PATENT DOCUMENTS

JP 2003-017272 A 1/2003
JP 2003-297559 A 10/2003
(Continued)

OTHER PUBLICATIONS

Korean Office Action issued Dec. 12, 2019 for corresponding Korean Application No. 10-2019-0137634.
(Continued)

*Primary Examiner* — Ashok Patel
(74) *Attorney, Agent, or Firm* — Michael Best & Friedrich LLP

(57) ABSTRACT

There are provided a display unit and an electronic apparatus that are capable of preventing color mixture in adjacent color pixels, and improving color reproducibility and chromaticity viewing angle. The display unit includes: a drive substrate having a plurality of pixels with a partition therebetween; and a first light shielding film provided on the partition.

16 Claims, 11 Drawing Sheets

Related U.S. Application Data continuation of application No. 17/227,982, filed on Apr. 12, 2021, now Pat. No. 11,659,739, which is a continuation of application No. 16/294,418, filed on Mar. 6, 2019, now Pat. No. 11,024,694, which is a continuation of application No. 15/981,494, filed on May 16, 2018, now Pat. No. 10,263,061, which is a continuation of application No. 15/408,627, filed on Jan. 18, 2017, now Pat. No. 9,991,325, which is a continuation of application No. 14/541,774, filed on Nov. 14, 2014, now Pat. No. 9,577,018.

(51) Int. Cl.
  *H10K 50/84* (2023.01)
  *H10K 50/86* (2023.01)
  *H10K 59/122* (2023.01)
  *H10K 59/35* (2023.01)
  *H10K 59/38* (2023.01)
  *H10K 102/00* (2023.01)

(52) U.S. Cl.
  CPC ......... *H10K 50/865* (2023.02); *H10K 59/122* (2023.02); *H10K 59/35* (2023.02); *H10K 59/38* (2023.02); *H10K 2102/00* (2023.02)

(56) References Cited

U.S. PATENT DOCUMENTS

| | | | |
|---|---|---|---|
| 8,629,472 | B2 | 1/2014 | Hayashi |
| 10,263,061 | B2 | 4/2019 | Negishi et al. |
| 11,024,694 | B2 | 6/2021 | Negishi et al. |
| 11,659,739 | B2 * | 5/2023 | Negishi ................. H10K 50/82 257/40 |
| 11,937,468 | B2 * | 3/2024 | Negishi ................. H10K 50/82 |
| 2005/0236950 | A1 | 10/2005 | Maeda |
| 2007/0295962 | A1 | 12/2007 | Choi |
| 2009/0236976 | A1 | 9/2009 | Lee |
| 2009/0236981 | A1 | 9/2009 | Chang et al. |
| 2010/0035456 | A1 | 2/2010 | Fan |
| 2014/0035456 | A1 | 2/2014 | Isa |
| 2015/0102376 | A1 | 4/2015 | Toya et al. |

FOREIGN PATENT DOCUMENTS

| | | |
|---|---|---|
| JP | 2004-335180 A | 11/2004 |
| JP | 2005-293946 A | 10/2005 |
| JP | 2005-294057 A | 10/2005 |
| JP | 2006-032010 A | 2/2006 |
| JP | 2006-243171 A | 9/2006 |
| JP | 2006294395 A | 10/2006 |
| JP | 2007-134327 A | 5/2007 |
| JP | 2007-512666 A | 5/2007 |
| JP | 2007-165214 A | 6/2007 |
| JP | 2007-220395 A | 8/2007 |
| JP | 2008-277186 A | 11/2008 |
| JP | 2009-104969 A | 5/2009 |
| JP | 2009-117758 A | 5/2009 |
| JP | 2009-206041 A | 9/2009 |
| JP | 2009-230990 A | 10/2009 |
| JP | 2012-134476 A | 7/2012 |
| JP | 2013-257803 A | 12/2013 |
| KR | 20080011622 A | 2/2008 |
| KR | 20090065104 A | 6/2009 |
| KR | 20090100020 A | 9/2009 |
| KR | 20120089950 A | 8/2012 |
| KR | 20120122534 A | 11/2012 |
| KR | 102143299 B1 | 8/2020 |
| WO | WO-2012115016 A1 | 8/2012 |

OTHER PUBLICATIONS

Korean Office Action issued May 28, 2019 for corresponding Korean Application No. 10-2014-0163248.

Korean Office Action dated Jan. 20, 2022 for corresponding Korean Application No. 10-2021-0059885.

\* cited by examiner

DISPLAY UNIT AND ELECTRONIC APPARATUS

CROSS REFERENCE TO RELATED APPLICATIONS

The present application is a Continuation of application Ser. No. 18/296,775, filed Apr. 6, 2023, which is a Continuation of application Ser. No. 17/227,982, filed Apr. 12, 2021, now U.S. Pat. No. 11,659,739, issued May 23, 2023, which is a Continuation of application Ser. No. 16/294,418, filed Mar. 6, 2019, now U.S. Pat. No. 11,024,694, issued Jun. 1, 2021, which is a Continuation of application Ser. No. 15/981,494, filed May 16, 2018, now U.S. Pat. No. 10,263,061, issued Apr. 16, 2019, which is a Continuation of application Ser. No. 15/408,627, filed Jan. 18, 2017, now U.S. Pat. No. 9,991,325, issued Jun. 5, 2018, which is a Continuation of application Ser. No. 14/541,774, filed Nov. 14, 2014, now U.S. Pat. No. 9,577,018, issued Feb. 21, 2017, and claims the benefit of Japanese Priority Patent Application JP 2013-272926 filed Dec. 27, 2013, the entire contents of which are incorporated herein by reference.

BACKGROUND

The present disclosure relates to a display unit emitting light with use of organic electroluminescence (EL) phenomenon, and to an electronic apparatus provided with the display unit.

Along with increasing pace of development of information and communication industry, a high-performance display element is demanded. In the circumstances, an organic EL element attracting attention as a next generation display element has advantages of high response speed in addition to wide viewing angle and excellent contrast, as a self-light-emitting display element.

In a display unit provided with the organic EL elements (the light emitting elements), a plurality of pixels are arranged in a display region, and for example, the organic EL element emitting red light (a red pixel R), green light (a green pixel G), or blue light (a blue pixel B) is provided in each of the pixels. In addition, a color element (a color filter) corresponding to each color pixel is provided on a counter surface of each organic EL element, which improves color purity of light extracted from the display unit.

Typically, a black matrix is provided between color elements in order to prevent color mixture from adjacent color pixels. However, light emitted from a light emitting element in an oblique direction (obliquely-emitted light) passes through the black matrix and enters the color pixels adjacently provided (adjacent color pixels), and thus causes degradation of color purity. Therefore, for example, in Japanese Unexamined Patent Application Publication Nos. 2005-294057 and 2005-293946, display units in which a black matrix is formed to have a thickness larger than that of a color filter to shield obliquely-entering light are disclosed. Moreover, for example, in Japanese Unexamined Patent Application Publication Nos. 2007-220395 and 2009-104969, display units in which a black matrix is formed on a color filter to decrease a distance between the black matrix and a light emission surface, and thus color mixture is suppressed are disclosed. On the other hand in Japanese Unexamined Patent Application Publication No. 2006-243171, a liquid crystal display unit in which a light shielding resin film (a black matrix) is formed on a thin film covering a colorant (corresponding to a color filter) to suppress color mixture is disclosed.

SUMMARY

However, it is technically difficult to form a black matrix with larger thickness than that of the color filter. Moreover, even if the black matrix is formed on the color filter, a distance between a light emission surface and the black matrix is decreased only by a film thickness of the color filter, and therefore, sufficient color mixture prevention effect is not obtained. Further, since the color filter is varied in film thickness depending on color pixel, which disadvantageously causes variation in chromaticity viewing angle for each color.

It is desirable to provide a display unit and an electronic apparatus that are capable of preventing color mixture in adjacent color pixels, and improving color reproducibility and chromaticity viewing angle.

According to an embodiment of the technology, there is provided a display unit including: a drive substrate having a plurality of pixels with a partition therebetween; and a first light shielding film provided on the partition.

According to an embodiment of the technology, there is provided an electronic apparatus provided with a display unit. The display unit includes: a drive circuit having a plurality of pixels with a partition therebetween; and a first light shielding film provided on the partition.

In the display unit and the electronic apparatus according to the respective embodiments of the technology, the first shielding film is provided on the partition that is provided between the pixels, which suppresses entering, to the adjacent color pixels (specifically, the color pixels adjacently provided), of emitted light (obliquely-emitted light) that is emitted at a large emission angle and thus may enter the adjacent pixels.

In the display unit and the electronic apparatus according to the respective embodiments of the technology, the first light shielding film is provided on the partition provided between the pixels. Therefore, it is possible to shield the obliquely-emitted light to prevent occurrence of color mixture in the adjacent color pixels. Consequently, it is possible to provide the display unit and the electronic apparatus that have high chromaticity viewing angle and high color reproducibility. Note that the effects described here are not necessarily limited, and effects described in the present disclosure may be obtained.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 11A is a perspective view illustrating an example of an appearance of an application example 1 of the display unit according to any of the above-described embodiments and the like.

DETAILED DESCRIPTION

Hereinafter, some embodiments, modifications, and application examples of the disclosure will be described in detail with reference to drawings. Note that description will be given in the following order.

1. First embodiment (an example in which a light shielding film is formed on a top surface of a partition)
   1-1. Basic structure
   1-2. Entire configuration of display unit
   1-3. Manufacturing method
   1-4. Function and effects
2. Second embodiment (an example in which a second light shielding film is added between a light shielding film on a partition and a BM)
3. Modifications (an example in which a light shielding film is formed on a top surface and an inclined surface of a partition)
4. Third embodiment (an example in which a reflective light shielding film is formed on a partition)
5. Application examples (examples of an electronic apparatus)

1. First Embodiment

Figure 1:
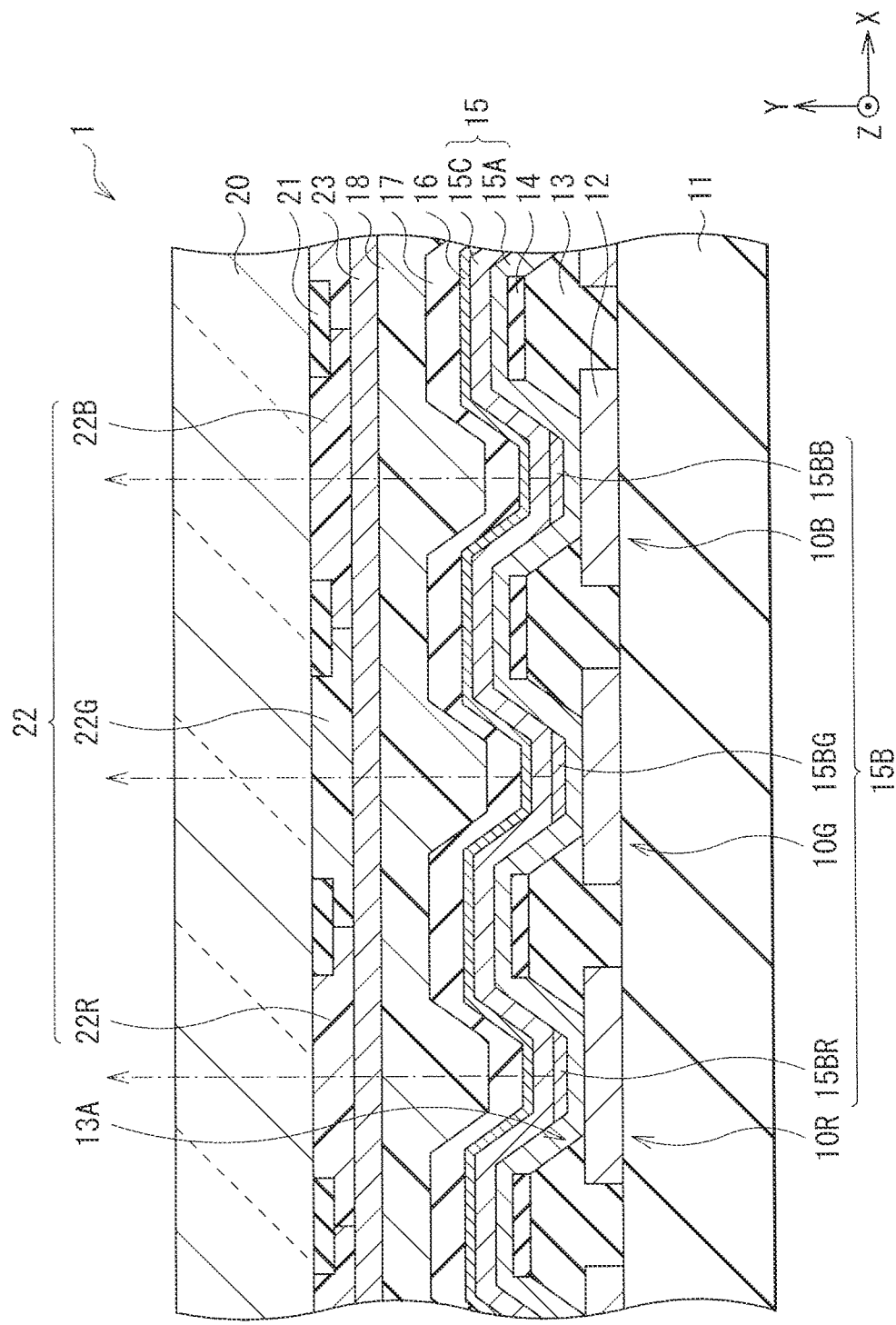
FIG. 1 is a sectional diagram illustrating a structure of a display unit according to a first embodiment of the disclosure.
Figure 4:
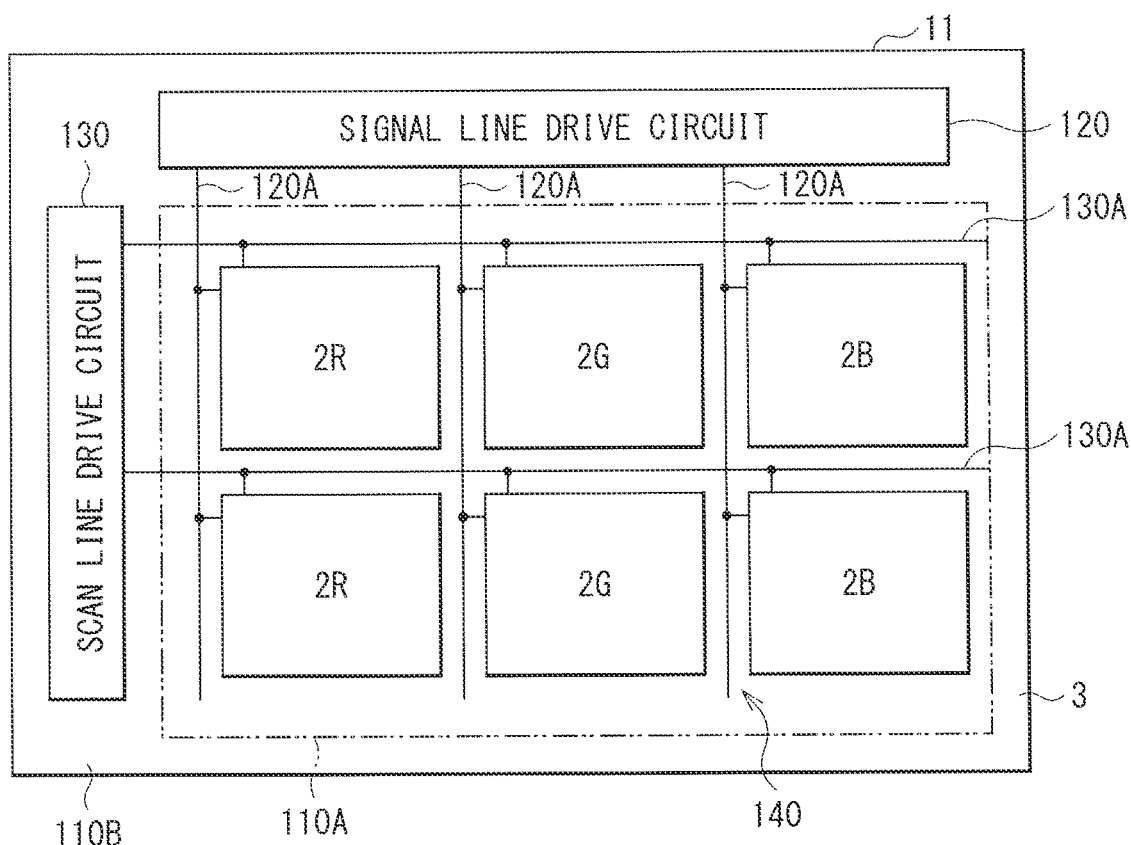
FIG. 4 is a diagram illustrating an entire configuration of the display unit illustrated in FIG. 1.

FIG. 1 illustrates an example of a sectional structure of a display unit (a display unit 1) according to a first embodiment of the disclosure. The display unit 1 may be used as, for example, a television receiver, and as illustrated in FIG. 4, a display region 110A and a peripheral region 110B that is provided on the periphery thereof are provided on a drive substrate 11. The display unit 1 includes a plurality of pixels 2 (for example, a red pixel 2R, a green pixel 2G, and a blue pixel 2B) that are arranged in a matrix in the display region 110A. In each of the pixels 2R, 2G, and 2B, a light emitting element 10 (a red light emitting element 10R, a green light emitting element 10G, and a blue light emitting element 10B, respectively) emitting corresponding single light (red light LR, green light LG, and blue light LB, respectively) is provided. The display unit 1 is a display unit of a top light emission type (so-called top emission type) that allows light emitted from the light emitting element 10 to be extracted from a top surface (a surface on a side opposite to the drive substrate 11) side. The peripheral region 110B is provided with a signal line drive circuit 120 and a scan line drive circuit 130 that are drivers for picture display.

(1-1. Basic Structure)

As illustrated in FIG. 1, in the display unit 1, each of the pixels 2R, 2G, and 2B is segmented by a partition 13 provided on the drive substrate 11. Color filters (CF) 22R, 22G, and 22B are provided on positions corresponding to the respective pixels 2R, 2G, and 2B (on the light emitting elements 10R, 10G, and 10B) on a counter surface of a counter substrate 20 that is provided oppositely to the drive substrate 11. A black matrix (BM) 21 that prevents color mixture from adjacent color pixels is provided between the CFs 22R, 22G, and 22B. In the first embodiment, the display unit 1 has a structure in which a light shielding film 14 (a first light shielding film) is provided on a top surface (specifically, a position facing the BM 21) of the partition 13.

Figure 5:
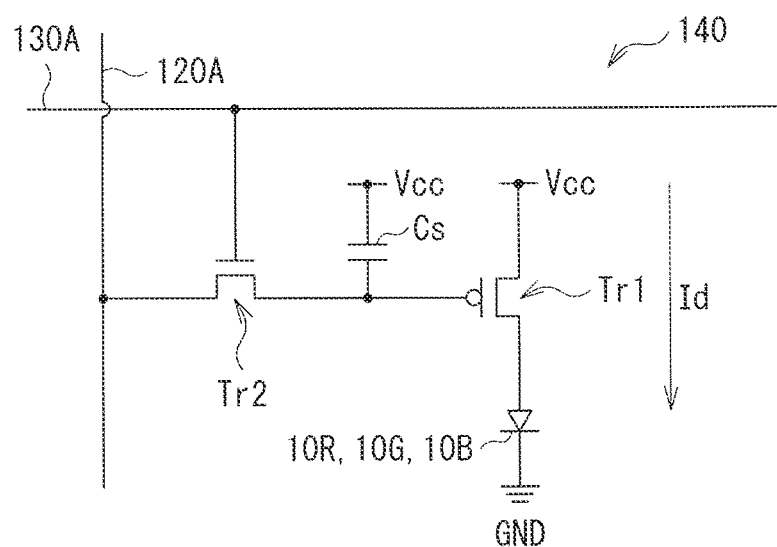
FIG. 5 is a circuit diagram illustrating an example of a pixel drive circuit illustrated in FIG. 4.

Each of the light emitting elements 10R, 10G, and 10B has a pixel electrode 12 as an anode, an organic layer 15 including a light emitting layer 15B, and a counter electrode 16 as a cathode that are stacked in order from the drive substrate 11 side provided with a drive transistor Tr1 and the like of the pixel drive circuit 140 (see FIG. 4 and FIG. 5). The partition 13 is provided between the light emitting elements 10R, 10G, and 10B, and the above-described light shielding film 14 is provided on the partition 13 and between the partition 13 and the organic layer 15 configuring the light emitting element 10.

Such light emitting elements 10R, 10G, and 10B are covered with a protection film 17 and a planarizing film 18, and further, the counter substrate 20 is bonded to the entire planarizing film 18 with an adhesive layer (not illustrated) in between. Note that the counter substrate 20 has the BM 21 and the CF 22 on the counter surface to the drive substrate 11, and an overcoat (OC) 23 is provided on the CF 22.

The pixel electrode 12 also has a function as a reflection layer, and may desirably have a reflectance as high as possible in order to enhance light emission efficiency. In particular, when the pixel electrode 12 is used as an anode, the pixel electrode 12 may be desirably formed of a material with higher hole injection property. For example, such a pixel electrode 12 may have a thickness in a stacked-layer direction (in the X-axis direction) (hereinafter, simply referred to as a thickness) of about 100 nm or more and about 1000 nm or less, and may be formed of a simple substance of a metal element of chromium (Cr), gold (Au), platinum (Pt), nickel (Ni), copper (Cu), tungsten (W), silver (Ag), and the like or an alloy containing any of these metal elements. A transparent conductive film formed of an indium tin oxide (ITO) or the like may be provided on a surface of the pixel electrode 12. Incidentally, as with an aluminum (Al) alloy, a material that has an issue of a hole injection barrier due to presence of an oxide film on the surface thereof and small work function while having high reflectance may be used as the pixel electrode 12 by providing an appropriate hole injection layer.

The partition 13 segments the pixels 2R, 2G, and 2B as described above, and electrically separates the light emitting elements 10R, 10G, and 10B from one another. An opening section 13A that is a light emitting region for each of the pixels 2R, 2G, and 2B is provided in the partition 13. Although detail will be described later, an organic layer 15 including a light emitting layer 15B (a red light emitting layer 15BR, a green light emitting layer 15BG, or a blue light emitting layer 15BB) configuring the corresponding light emitting element 10R, 10G, or 10B is provided in the opening section 13A. Examples of the material of the partition 13 may include, for example, an organic material such as polyimide, a novolak resin, and an acrylic resin. However, the material of the partition 13 is not limited thereto, and for example, the organic material and an inorganic material may be combined and used. Examples of the inorganic material may include $SiO_2$, SiO, SiC, and SiN. For example, although the partition 13 may be formed as a single layer film of the above-described organic material, may be formed to have a stacked-layer structure of an organic film and an inorganic film when the organic material and the inorganic material are combined. Incidentally, the organic layer 15 and the counter electrode 16 are provided also on the partition 13; however, light is emitted from only the light emitting region.

In the first embodiment, the partition 13 includes the top surface that has a flat plane parallel to the drive substrate 11, and includes a side surface (an inclined surface) that is inclined in a forward tapered shape. The light shielding film 14 is provided on the top surface of the partition 13.

Figure 2:
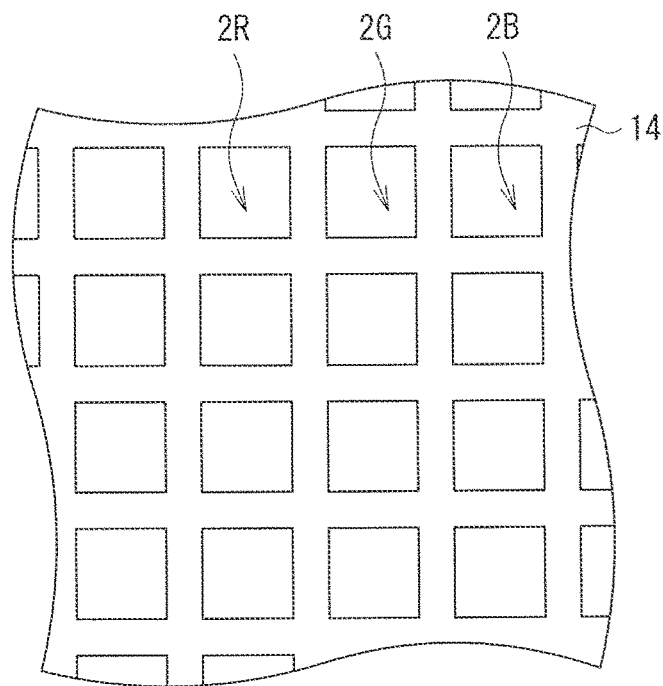
FIG. 2 is a plan view illustrating a shape of a light shielding film in the display unit illustrated in FIG. 1.
Figure 3:
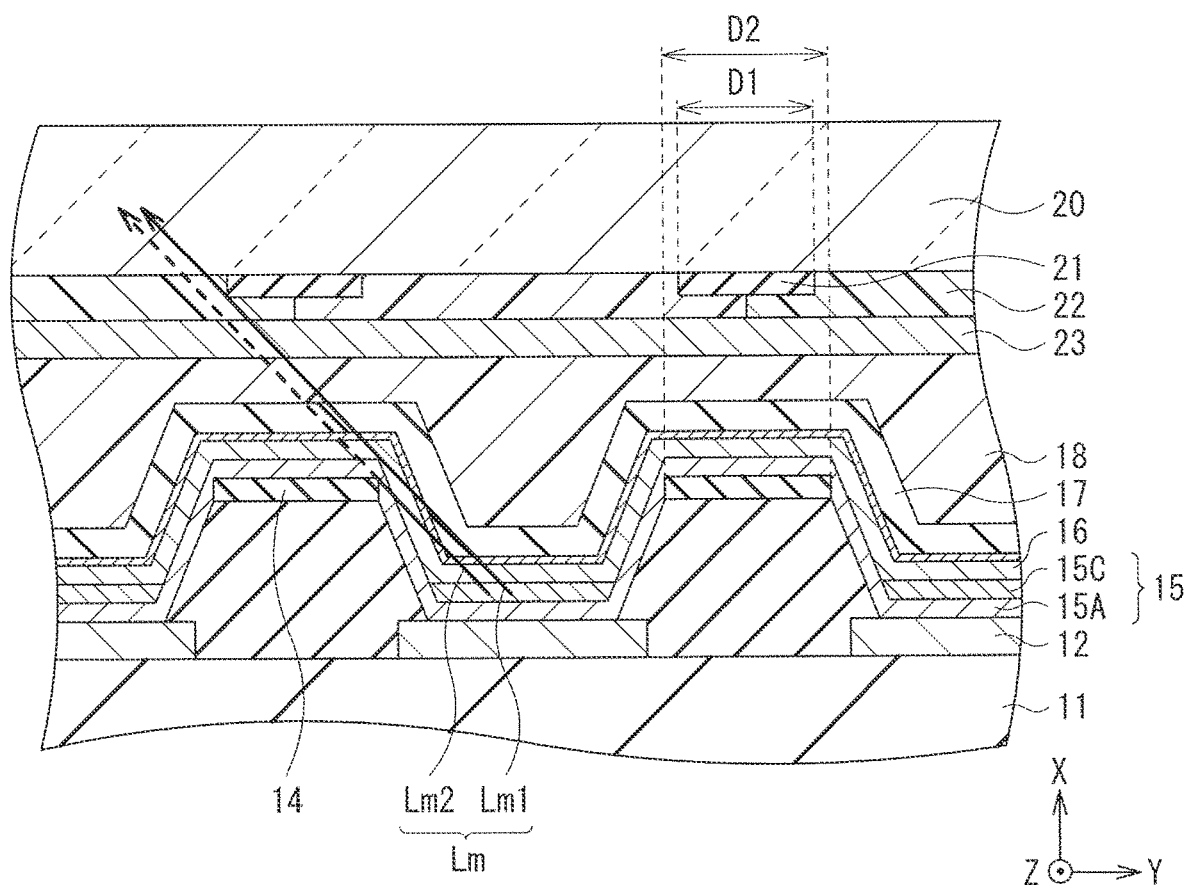
FIG. 3 is a schematic diagram explaining an effect of the display unit illustrated in FIG. 1.

The light shielding film 14 is provided on the top surface of the partition 13 as described above, and as illustrated in FIG. 2, has a lattice shape segmenting each of the pixels 2R, 2G, and 2B as viewed from the flat plane. As illustrated in FIG. 3, the light shielding film 14 prevents obliquely-emitted light (for example, Lm2) that may cause color mixture in adjacent color pixels, out of light emitted from the light emitting layer 15B, from entering the adjacent color pixels. A width (D2) of the light shielding film 14 may be preferably larger than a width (D1) of the BM 21 described later. In other words, the light shielding film 14 may be preferably formed so that an end surface thereof is located on a pixel side rather than an end surface of the opening of the BM 21. As a result, it is possible to obtain high light shielding effect with respect to the obliquely-emitted light that may enter the adjacent color pixels. The thickness of the light shielding film 14 may be, for example, about 0.1 μm or more and about 1 μm or less. A light absorbing material may be preferably used as the material of the light shielding film 14, and for example, a material of the same kind as that of the BM 21 may be used for the light shielding film 14. Specifically, a carbon (C), chromium oxide ($Cr_2O_3$), and an alloy of samarium (Sm) and silver (Ag), or an organic material may be used. The light shielding film 14 may be configured as a single layer film or a stacked-layer film formed of any of these materials. Examples of a specific stacked-layer film may include a metal stacked-layer film such as vanadium oxide (VO)/Ag or a stacked-layer film of an organic material and a metal material such as Al/mixture of copper phthalocyanine and Al (CuPc:Al)/Al, Al/DCJTB/Al, and Al/DCJTB:CuPc:Al/Al.

Note that forming the light shielding film 14 by a light absorbing material makes it possible to reduce external light reflection and to improve contrast. Moreover, forming the light shielding film 14 by a conductive material and setting the light shielding film 14 and the cathode electrode (here, the counter electrode 16) to the same potential (for example, connecting to GND) makes it possible to prevent leakage of a current into the adjacent color pixels. As a result it is possible to reduce color mixture caused by unintentional light emission of the adjacent color pixels due to the leakage current.

For example, the organic layer 15 may have a structure in which a hole supply layer 15A, the light emitting layer 15B, and an electron supply layer 15C are stacked in order from the pixel electrode 12 side. Among them, layers other than the light emitting layer 15B may be provided as necessary. The organic layer 15 may be different in structure depending on the emitted color from the light emitting elements 10R, 10G, and 10B. For example, the hole supply layer 15A may have a structure in which a layer having a hole injection property (a hole injection layer) and a layer having a hole transport property (a hole transport layer) are stacked in this order from the pixel electrode 12 side. The hole injection layer is a buffer layer that enhances hole injection efficiency to the light emitting layer 15B and prevents leakage. The hole transport layer enhances hole transport efficiency to the light emitting layer 15B. In the light emitting layer 15B, electrons and holes are recombined by application of an electric field, and therefore light is emitted. For example, the electron supply layer 15C may have a structure in which a layer having an electron transport property (an electron transport layer) and a layer having an electron injection property (an electron injection layer) are stacked in this order from the light emitting layer 15B side. The electron transport layer enhances electron transport efficiency to the light emitting layer 15B. The electron injection layer enhances electron injection efficiency.

In the hole supply layer 15A, the hole injection layer may have a thickness of, for example, about 5 nm or more and about 300 nm or less, and may be formed of, for example, a hexa-aza triphenylene derivative. The hole transport layer may have a thickness of, for example, about 5 nm or more and about 300 nm or less, and may be formed of bis[(N-naphthyl)-N-phenyl]benzidine (α-NPD). The light emitting layer 15B may have a thickness of, for example, about 10 nm or more and about 100 nm or less. For example, the red light emitting layer 15BR may be configured of a mixture obtained by mixing 40 vol % of 2,6-bis[4-[N-(4-methoxyphenyl)-N-phenyl]aminostyryl]naphthalene-1,5-dicarbonitrile (BSN-BCN) to 8-quinolinol aluminum complex (Alq3). In the electron supply layer 15C, the electron transport layer may have a thickness of, for example, about 5 nm or more and about 300 nm or less, and may be formed of Alq3. The electron injection layer may have a thickness of, for example, about 0.3 nm, and may be formed of LiF, $Li_2O$, or the like.

The counter electrode 16 may have a thickness of, for example, about 10 nm, and may be formed of an alloy of Al, magnesium (Mg), calcium (Ca), or Ag. Among them, an alloy of Mg and Ag (Mg—Ag alloy) may be preferable because the alloy has conductivity and small absorption in a thin film state. A ratio of Mg and Ag in the Mg—Ag alloy is not particularly limited: however, the ratio of Mg and Ag may be preferably within the range of Mg:Ag=20:1 to 1:1 in film thickness ratio. Moreover, the material of the counter electrode 16 may be an alloy of Al and lithium (Li) (Al—Li alloy).

Moreover, the counter electrode 16 may also have a function as a semipermeable reflective layer. When the counter electrode 16 has the function as the semipermeable reflective layer, the light emitting element 10 has a resonator structure, and resonates light that is emitted from the light emitting layer 15B, between the pixel electrode 12 and the counter electrode 16 with use of the resonator structure.

The protection layer 17 is formed on the counter electrode 16, and may be formed of, for example, an inorganic material such as silicon oxide ($SiO_x$), silicon nitride ($SiN_x$), silicon oxynitride ($SiN_xO_y$), titanium oxide ($TiO_x$), and aluminum oxide ($Al_xO_y$).

The planarizing film 18 is formed on the protection film 17 substantially uniformly. The planarizing film 18 may function also as the above-described adhesive layer, and may be formed of, for example, an epoxy resin or an acrylic resin.

The counter substrate 20 seals the light emitting elements 10R, 10G, and 10B, and is formed of a material such as glass having permeability to light emitted from the light emitting elements 10R, 10G, and 10B. For example, the BM 21 and the CF 22 may be provided on a surface (an opposed surface) on the drive substrate 11 side of the counter substrate 20. The BM 21 and the CF 22 extract light LR, LG, and LB that are respectively emitted from the red light emitting element 10R, the green light emitting element 10G, and the blue light emitting element 10B, and absorb external light that is reflected by the light emitting elements 10R, 10G, and 10B and the wirings therebetween to improve contrast.

The BM 21 is provided at a position corresponding to between the pixels 2R, 2G, and 2B (specifically, the partition 13) between the counter substrate 20 and the CF 22. For example, the BM 21 may be formed of a black resin film that is mixed with a black colorant and has optical density of 1 or more, or a thin film filter using thin film interference. Among them, the BM 21 may be preferably formed of the black resin film because it is low in cost and is formed easily. For example, the thin film filter may be configured by stacking one or more thin films formed of a metal, a metal nitride, or a metal oxide, and may attenuate light with use of the thin film interference. Specific examples of the thin film filter may include a filter configured by alternately stacking $Cr_2O_3$ and one of C and Cr.

The CF 22 may include, for example, a red filter 22R, a green filter 22G, and a blue filter 22B that are arranged corresponding to the light emitting elements 10R, 10G, and 10B, respectively. The red filter 22R, the green filter 22G, and the blue filter 22B each may be formed in, for example, a rectangular shape and are arranged without clearance. The red filter 22R, the green filter 22G, and the blue filter 22B are each formed of a resin mixed with a pigment, and are adjusted by selection of the pigment so that light transmittance in a target wavelength range of red, green or blue becomes high and light transmittance in other wavelength ranges becomes low.

The overcoat (OC) film 23 formed of a transparent insulating material or a transparent conductive material is provided on the BM 21 and the CF 22. Examples of the insulating material may include, for example, an organic material such as polyimide and acryl, and an inorganic material such as silicon oxide ($SiO_x$), silicon nitride ($SiN_x$), silicon oxynitride ($SiN_xO_y$), titanium oxide ($TiO_x$), and aluminum oxide ($Al_xO_y$). Examples of the conductive material may include, for example, ITO and IZO. Note that the OC 23 is not necessarily formed and may be omitted.

(1-2. Entire Configuration of Display Unit)

FIG. 4 illustrates an entire configuration of the display unit 1. As described above, the display unit 1 has the signal line drive circuit 120 and the scan line drive circuit 130 that are drivers for picture display, in the peripheral region 110B on the periphery of the display region 110A. The pixel drive circuit 140 is provided in the display region 110A.

FIG. 5 illustrates an example of the pixel drive circuit 140. The pixel drive circuit 140 is an active drive circuit formed in a lower layer of the pixel electrode 12. Specifically, the pixel drive circuit 140 has a drive transistor Tr1, a write transistor Tr2, a capacitor (a retention capacitance) Cs between the transistors Tr1 and Tr2, and the light emitting element 10R (or 10G or 10B) that is connected in series to the drive transistor Tr1 between a first power line (Vcc) and a second power line (GND). The drive transistor Tr1 and the write transistor Tr2 are each formed of a typical thin film transistor, and the structure thereof may be, for example, an inversely staggered structure (so-called bottom gate type) or a staggered structure (a top gate type) without specific limitation.

In the pixel drive circuit 140, a plurality of signal lines 120A are provided in a column direction, and a plurality of scan lines 130A are provided in a row direction. An intersection between each of the signal lines 120A and each of the scan lines 130A corresponds to any one of the light emitting elements 10R, 10G, and 10B (the pixels 2R, 2G, and 2B). Each of the signal lines 120A is connected to the signal line drive circuit 120, and an image signal is supplied from the signal line drive circuit 120 to a source electrode of the write transistor Tr2 through the signal line 120A. Each of the scan lines 130A is connected to the scan line drive circuit 130, and a scan signal is sequentially supplied from the scan line drive circuit 130 to a gate electrode of the write transistor Tr2 through the scan line 130A.

(1-3. Manufacturing Method)

The display unit 1 according to the first embodiment is manufactured with use of the following method.

First, the pixel drive circuit 140 including the pixel electrode 12 and the drive transistor Tr1 is formed on the drive substrate 11 made of the above-described material, and then a photosensitive resin is applied to the entire surface of the drive substrate 11 to form a planarizing insulating film (not illustrated). Next, the pixel electrode 12 made of the above-described material may be formed by, for example, sputtering, and the pixel electrode 12 is selectively removed by wet etching to separate the pixel electrode 12 for each of the light emitting elements 10R, 10G, and 10B.

Subsequently, for example, a photosensitive resin to be the partition 13 may be applied on the entire surface of the drive circuit 11, and the opening section 13A corresponding to the light emitting region may be formed by, for example, photolithography, followed by firing to form the partition 13. Next, the hole supply layer 15A, the light emitting layer 15B, and the electron supply layer 15C of the organic layer 15 made of the above-described material with the above-described thickness may be formed by, for example, an evaporation method. Then, the counter electrode 16 made of the above-described material with the above-described thickness may be formed by, for example, the evaporation method. As a result, the light emitting elements 10R, 10G, and 10B illustrated in FIG. 1 are formed.

Subsequently, the protection film 17 made of the above-described material may be formed by, for example, a CVD method or sputtering on the light emitting elements 10R, 10G, and 10B. Then, the planarizing film 18 is formed on the protection film 17, and the counter substrate 20 that is provided with the CF 22 and the BM 21 covered with the OC 23 is bonded to the drive substrate 11 with the planarizing film 18 (or an adhesive layer) in between. In this way, the display unit 1 illustrated in FIG. 1 and FIG. 4 is completed.

In the display unit 1, the scan signal is supplied from the scan line drive circuit 13 to each of the pixels 2R, 2G, and 2B through the gate electrode of the write transistor Tr2, and the image signal is retained in the retention capacitance Cs from the signal line drive circuit 120 through the write transistor Tr2. In other words, the drive transistor Tr1 is controlled to be turned on or off in response to the signal retained by the retention capacitance Cs, and thus a drive current Id is injected into the light emitting elements 10R, 10G, and 10B, which causes recombination of the holes and the electrons to emit light. For example, the light LR, LG, and LB are reflected multiply between the pixel electrode 12 and the counter electrode 16, or the reflected light by the pixel electrode 12 and the light emitted from the light emitting layer 15B reinforce each other by interference, and resultant light is extracted after passing through the counter electrode 16, the color filter 23, and the counter substrate 20.

(1-4. Function and Effects)

In the typical display unit, obliquely-entering light from adjacent color pixels is shielded by a black matrix (for example, the BM 21 in the display unit 1) provided on the counter substrate side, and occurrence of color mixture is suppressed. However, it is difficult to sufficiently shield the obliquely-entering light from the adjacent color pixels depending on a distance (specifically, the thicknesses of the respective layers configuring the light emitting element, the planarizing film, and the like) between a light emitting part (specifically, the light emitting layer) and an extraction part of the emitted light (for example, the opening of the black matrix), which disadvantageously causes degradation in chromaticity viewing angle due to color mixture.

As a method of improving light shielding effect by the black matrix, a method in which the width in the flat plane direction of the black matrix is increased, or a method in which the film thickness of the black matrix is increased as described above are considered. However, there are disadvantages that luminance is decreased with decrease of an opening ratio and manufacturing is difficult in such methods.

In contrast, in the display unit 1 of the first embodiment, the light shielding film 14 is provided on the partition 13 that segments each of the pixels 2R, 2G, and 2B. As a result, it is possible to further reduce entering of the obliquely-emitted light to the adjacent color pixels. Specifically, as illustrated in FIG. 3, out of the light Lm that is emitted at a large emission angle to the X-axis direction and thus may enter the adjacent color pixels, for example, obliquely-emitted light Lm1 emitted at the center part of the light emitting layer 15BG may be shielded by the BM 21 provided on the counter substrate 20. On the other hand, for example, obliquely-emitted light Lm2 emitted on an outer side than the center part of the light emitting layer 15BG may not be shielded by the BM 21 provided on the counter substrate 20 side. However, as with the first embodiment, by forming the light shielding film 14 on the partition 13, the obliquely-emitted light Lm2 is shielded by the light shielding film 14.

Therefore, in the display unit 1 according to the first embodiment, since the light shielding film 14 is provided on the partition 13 segmenting each of the pixels 2R, 2G, and 2B, it is possible to reduce occurrence of color mixture by the obliquely-emitted light. Accordingly, it is possible to provide the display unit having high chromaticity viewing angle characteristics.

Moreover, in the first embodiment, the light shielding film 14 is formed of a light absorbing material, which makes it possible to reduce external light reflection, and thus contrast is allowed to be improved. Alternatively, the light shielding film 14 is formed using a conductive material, which makes it possible to prevent leakage of the current into the adjacent color pixels. As a result, light emission of the adjacent color pixels due to electrical leakage is suppressed. Therefore, it is possible to provide the display unit with higher color reproducibility.

Next, a second embodiment and modifications will be described. Hereinafter, like numerals are used to designate substantially like components of the above-described first embodiment, and the description thereof is appropriately omitted.

2. Second Embodiment

Figure 6:
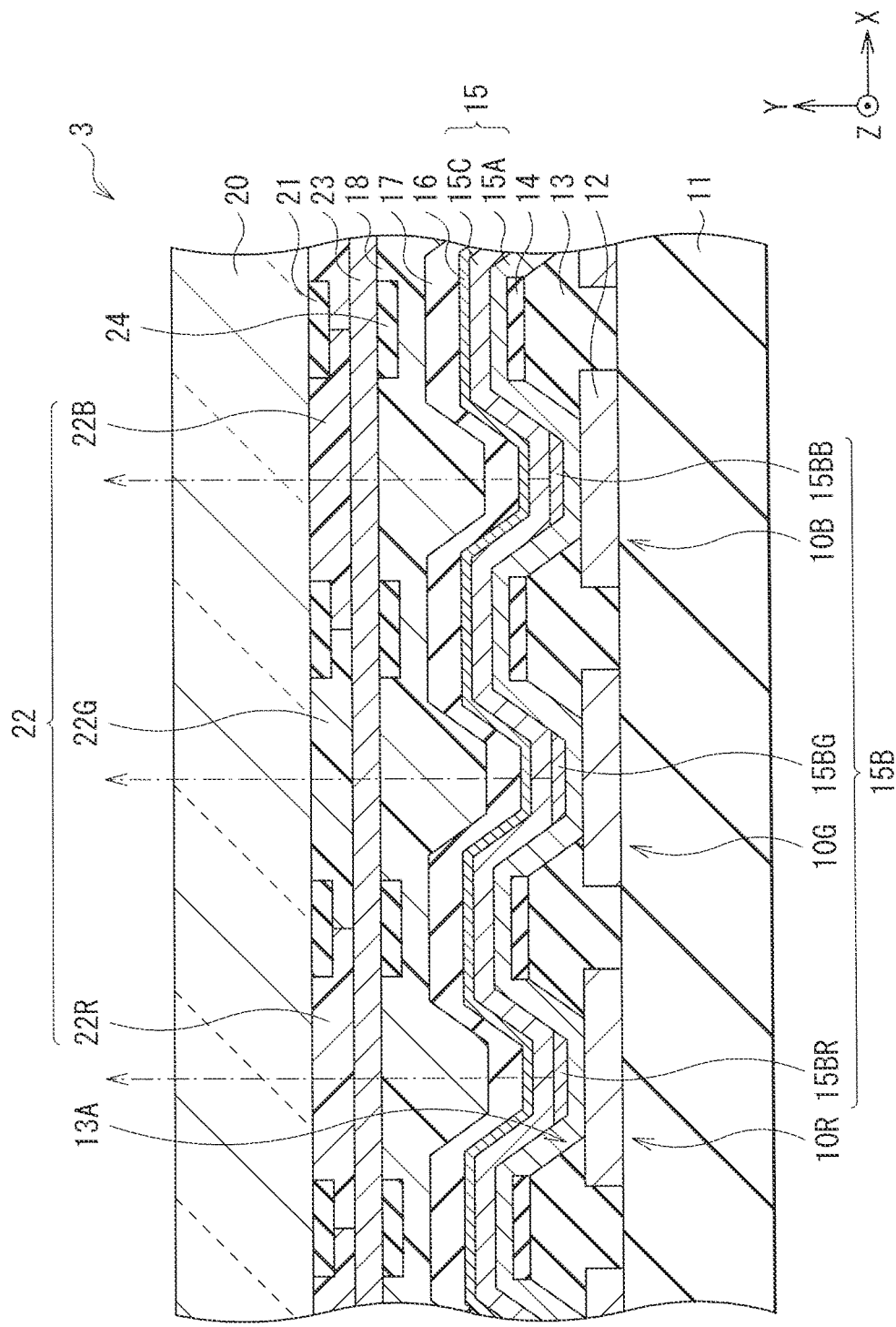
FIG. 6 is a sectional diagram illustrating a structure of a display unit according to a second embodiment of the disclosure.

FIG. 6 illustrates a sectional structure of a display unit 3 according to the second embodiment of the disclosure. Similarly to the above-described first embodiment, the display unit 3 may be used as, for example, a television receiver, and may be a top emission type display unit allowing emitted light to be extracted from a top surface side. The display unit 3 according to the second embodiment is different from the above-described first embodiment in that a light shielding film 24 (a second light shielding film) is formed between the BM 21 provided on the counter substrate 20 side and the light shielding film 14 provided on the partition 13 that is provided in the above-described first embodiment.

The light shielding film 24 is provided in a region where the light shielding film 14 provided on the partition 13 as described above faces the BM 21 provided on the counter substrate 20 side. Specifically, for example, the light shielding film 24 may be provided on a surface on the drive substrate 11 side of the OC 23, and may have a lattice shape to segment each of the pixels 2R, 2G, and 2B, similarly to the light shielding film 14 and the BM 21. When the light shielding film 24 is formed to have a width (D3) larger than the width (D1) of the BM 21, the light shielding film 24 is allowed to effectively shield the obliquely-emitted light that may enter the adjacent color pixels (see FIG. 7). Note that, to maintain a viewing angle at which vignetting is caused by the BM 21, the width (D3) of the light shielding film 24 may be preferably, for example, $(d2 \times D4 + d1 \times D1)/(d1+d2)$ or lower. A thickness of the light shielding film 24 may be preferably, for example, about 0.1 µm or more and about 1 µm or lower. The material of the same kind as that of the light shielding film 14 and the BM 21 may be used as the material of the light shielding film 24.

Figure 7:
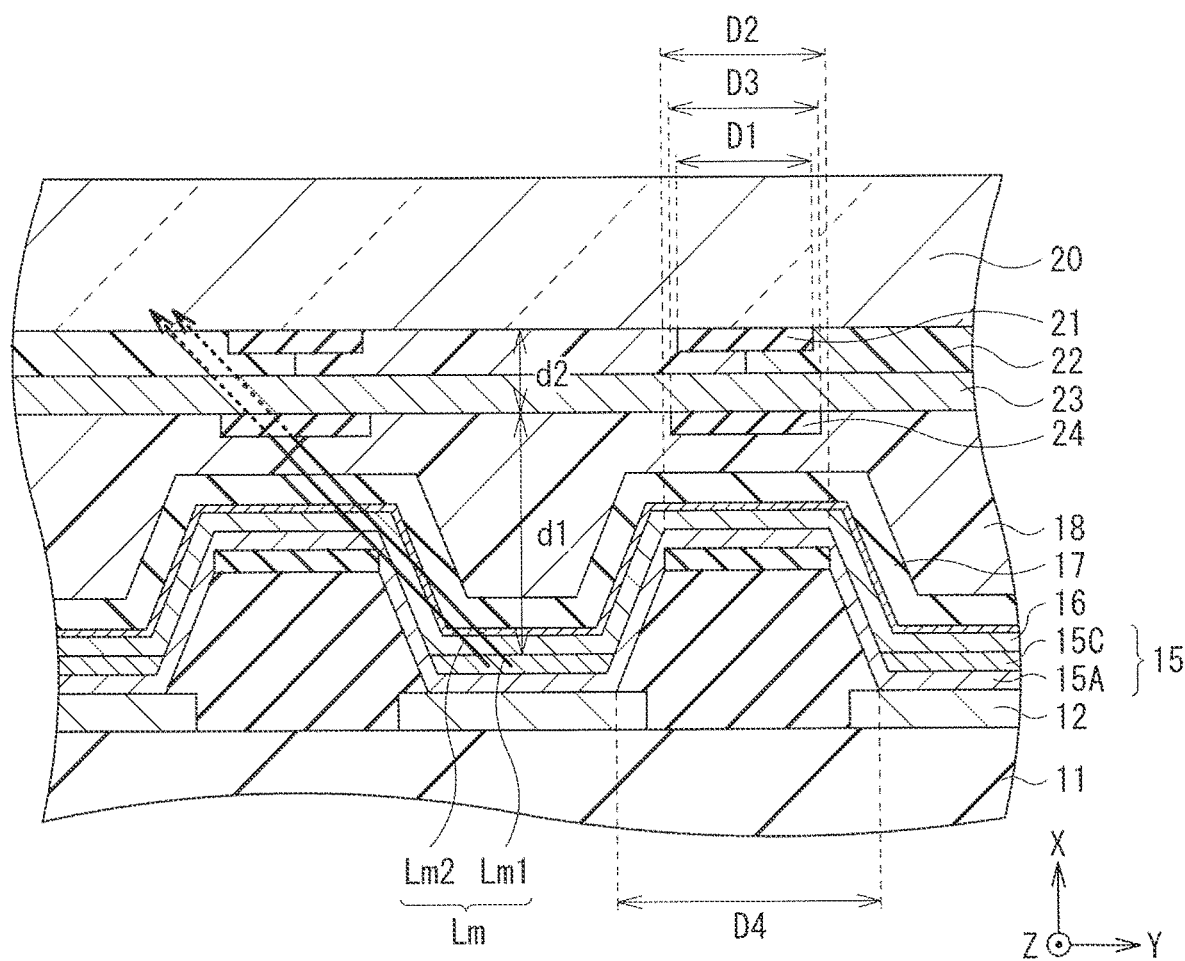
FIG. 7 is a schematic diagram explaining an effect of the display unit illustrated in FIG. 6.

As described above, in the second embodiment, the light shielding film 24 is provided in the region where the light shielding film 14 on the partition 13 faces the BM 21 on the counter substrate 20. Therefore, as illustrated in FIG. 7, out of the obliquely-emitted light Lm emitted from the light emitting layer 15B, light that is not shielded by the light shielding film 14 and the BM 21 (for example, Lm2 and Lm1) is allowed to be shielded. Therefore, it is possible to reduce occurrence of color mixture caused by emitted light (obliquely-emitted light) that is emitted at a large emission angle and thus may enter the adjacent color pixels, and therefore to provide the display unit with higher chromaticity viewing angle characteristics.

3. Modifications

Figure 8:
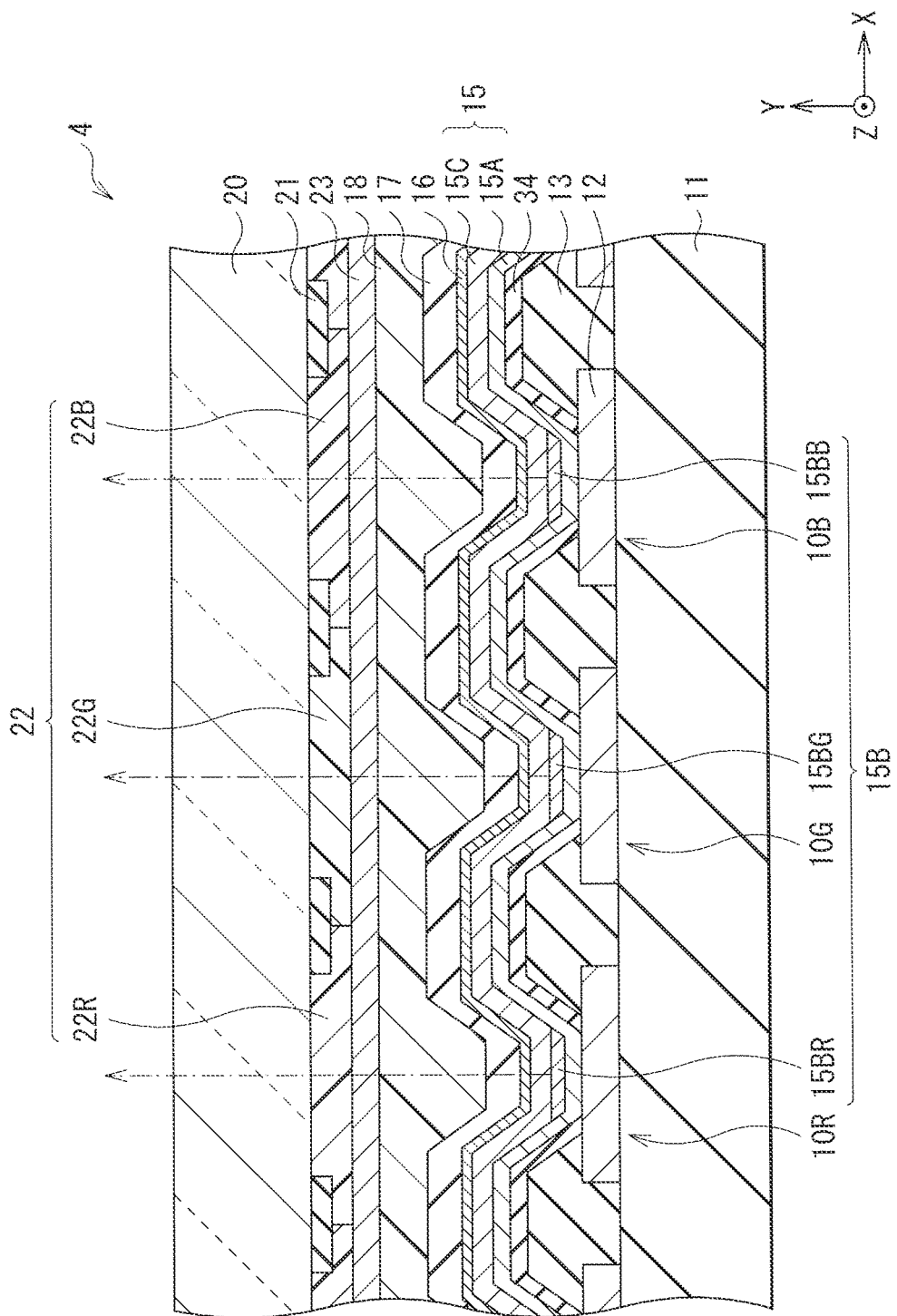
FIG. 8 is a sectional diagram illustrating a structure of a display unit according to a modification of the first embodiment of the disclosure.

FIG. 8 illustrates a sectional structure of a display unit 4 according to a modification of the above-described first embodiment. The display unit 4 according to the present modification is different from the above-described first embodiment in that a light shielding film 34 provided on the partition 13 is formed in a region wider than that of the light shielding film 14 of the above-described first embodiment, more specifically, the light shielding film 34 is formed on the entire top surface and the entire inclined surface of the partition 13.

As described above, in the display unit 4 according to the present modification, the light shielding film 34 may be provided on the entire top surface and the entire inclined surface of the partition 13. As a result, it is possible to obtain effect that external light reflection is further suppressed, in addition to the effects of the above-described embodiment.

Moreover, light emitted in the vicinity of an end surface of the light emitting layer 15B passes through the partition 13 and then enters the adjacent color pixels, and is reflected or scattered by the side surface (the inclined surface) of the partition 13 that segments the adjacent pixel, to generate color mixture. In the present modification, since the inclined surface of the partition 13 is also covered with the light shielding film 34, it is possible to prevent the light emitted in the vicinity of the end surface from entering (being leaked into) the adjacent color pixels. Accordingly, it is possible to further reduce occurrence of color mixture. Covering the entire partition 13 with the light shielding film 34 makes it possible to reduce intrusion of moisture and gas such as oxygen from the partition 13 to the organic layer 15. As a result, it is possible to improve reliability of the light emitting element 10 and the display unit provided with the light emitting element 10.

Figure 9:
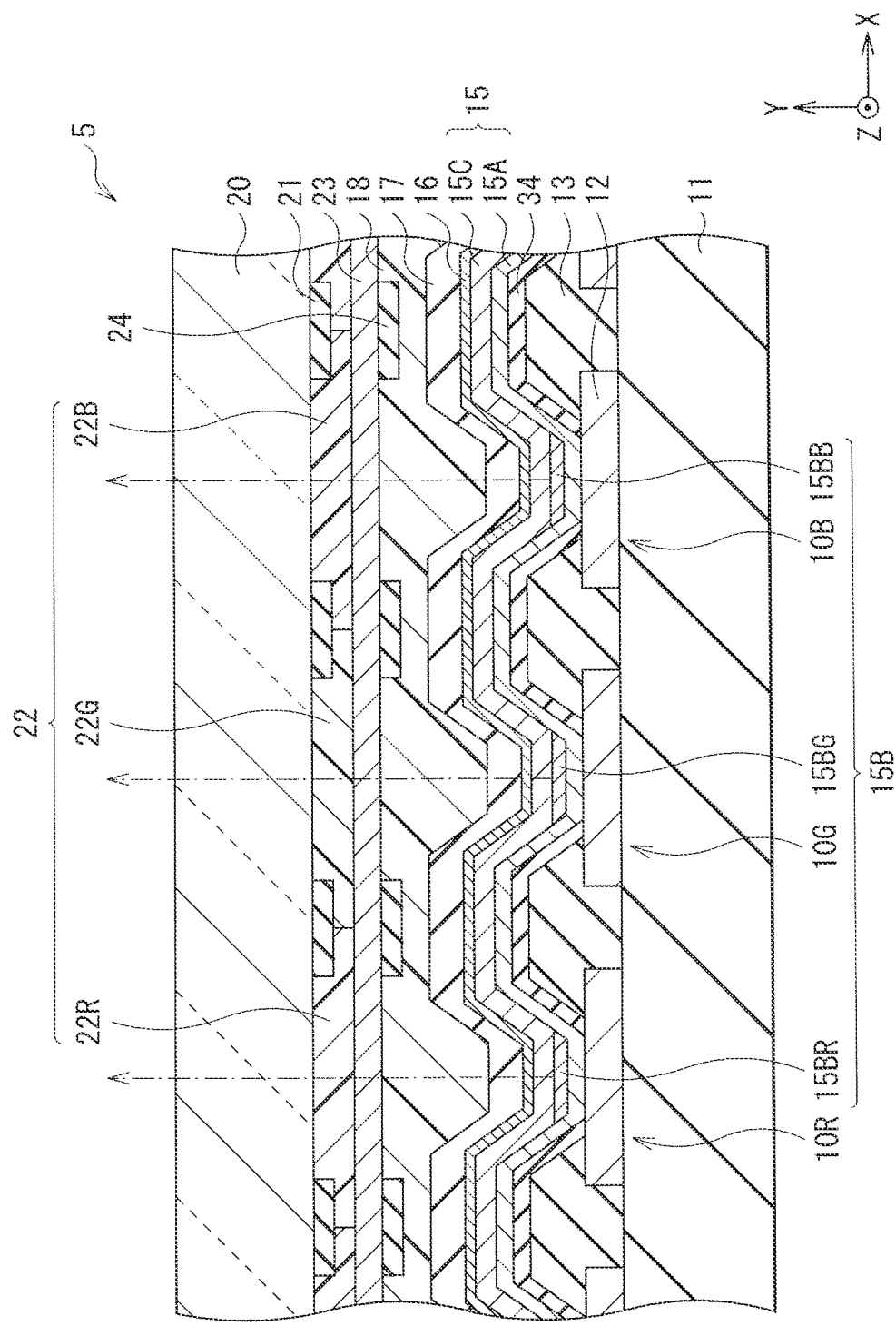
FIG. 9 is a sectional diagram illustrating a structure of a display unit according to a modification of the second embodiment of the disclosure.

Incidentally, the present modification may be applied to the above-described second embodiment as with a display unit 5 illustrated in FIG. 9.

4. Third Embodiment

Figure 10:
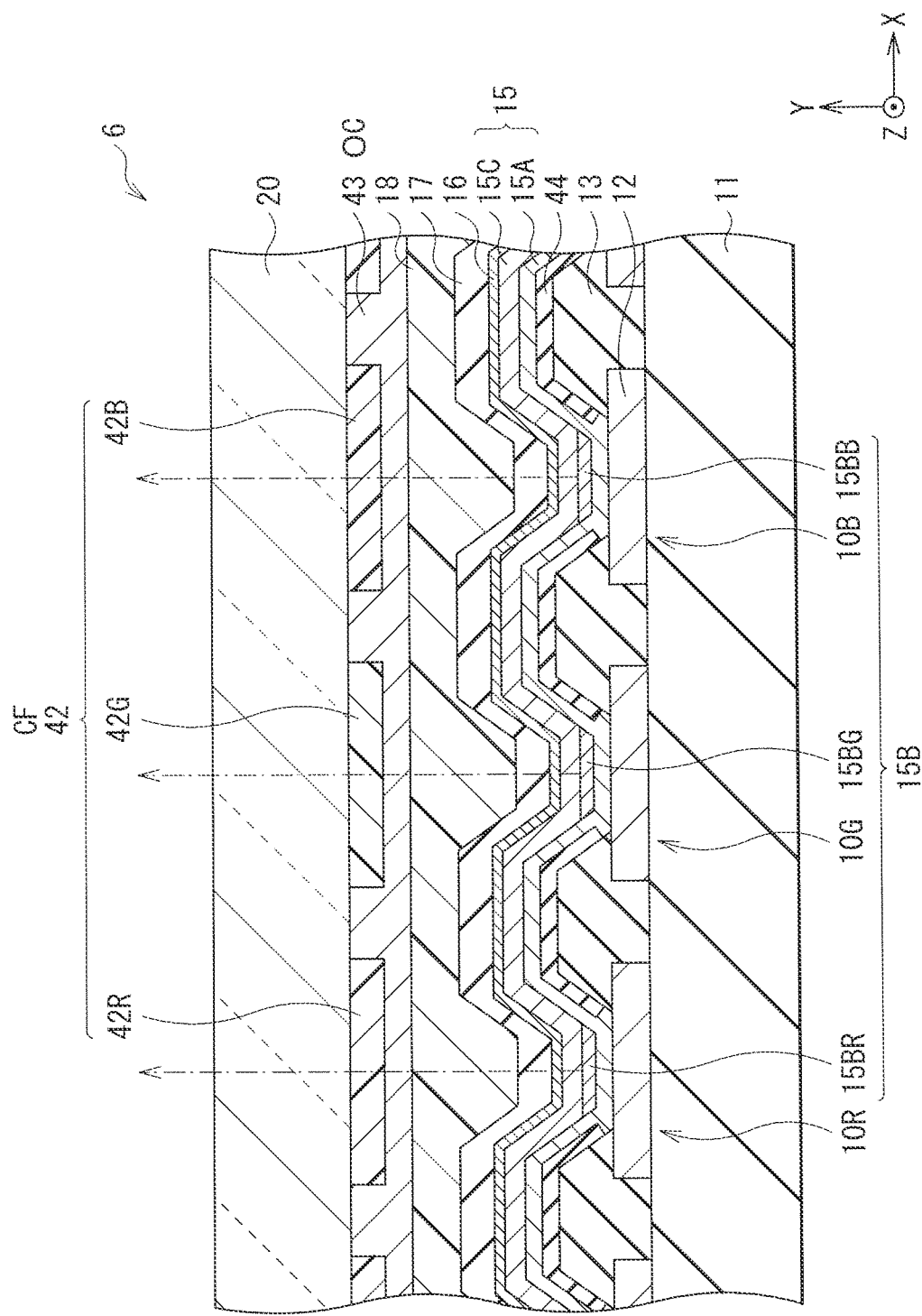
FIG. 10 is a sectional diagram illustrating a structure of a display unit according to a third embodiment of the disclosure.

FIG. 10 illustrates a sectional structure of a display unit 6 according to a third embodiment of the disclosure. The display unit 6 is a top emission type display unit that allows emitted light to be extracted from a top surface side, similar to the above-described first embodiment and the like. The display unit 6 of the third embodiment is different from the above-described first embodiment in that a light shielding film 44 having light reflectivity is provided on the partition 13 and the black matrix typically provided on the counter substrate 20 side is omitted. With this configuration, the display unit 6 is allowed to be used as a so-called mirror display that is usable as a mirror in non-display state.

The light shielding film 44 is provided on the partition 13 as described above. Specifically, the light shielding film 44 is provided on the top surface and the inclined surface of the partition 13. The light shielding film 44 may be formed of a material having light reflectivity, and for example, a simple substance of a metal element such as Al, Cr, gold (Au), platinum (Pt), nickel (Ni), Cu, tungsten (W), and Ag, or an alloy containing these metal elements may be used for the light shielding film 44. It is sufficient for the light shielding film 44 to have a thickness allowing the light entered from the outside (external light) to be reflected, and for example, the thickness of the light shielding film 44 may be about 0.1 μm or more and about 1 μm or less.

Incidentally, when a material having conductivity is used as the material of the light shielding film 44, the light shielding film 44 may be preferably formed so that the end surface of the light shielding film 44 is not in contact with the pixel electrode 12. Moreover, the structure on the counter substrate 20 side may be preferably a structure as illustrated in FIG. 10 because the black matrix is omitted. Specifically, CFs 42R, 42G, and 42B of a CF 42 may be preferably formed independently of one another on the counter substrate 20 so that a clearance is formed at a position corresponding to the partition 13. Moreover an overcoat (OC) 43 is provided on the CF 42 so that the clearance between the CFs 42R, 42G, and 42B in order to improve adhesiveness of the counter substrate 20 and the CF 42.

As described above, in the display unit 6 according to the third embodiment, the light shielding film 44 having light reflectivity is provided on the partition 13. As a result, similarly to the above-described first embodiment and the like, it is possible to shield the obliquely-emitted light that may enter the adjacent color pixels, and it is possible to provide a display unit that has high chromaticity viewing angle characteristics and is usable as a mirror in a non-display state.

5. Application Examples

Application examples of the display units 1 and 3 to 6 described in the above-described first to third embodiments and the modifications are described. The display units 1 and 3 to 6 are applicable to electronic apparatuses in every field, such as a television receiver, a digital camera, a notebook personal computer, a mobile terminal such as a mobile phone, and a video camera. As described above, the display unit according to any of the above-described embodiments and the like is applicable to electronic apparatuses in every field that displays a picture signal input from the outside or a picture signal internally generated as an image or a picture.

Incidentally, the present technology exerts higher effects in a large-scale television receiver with high definition, a medical display, and electronic apparatuses having a high-pitched display panel such as a smartphone and a mobile phone.

Application Example 1

Figure 11A:
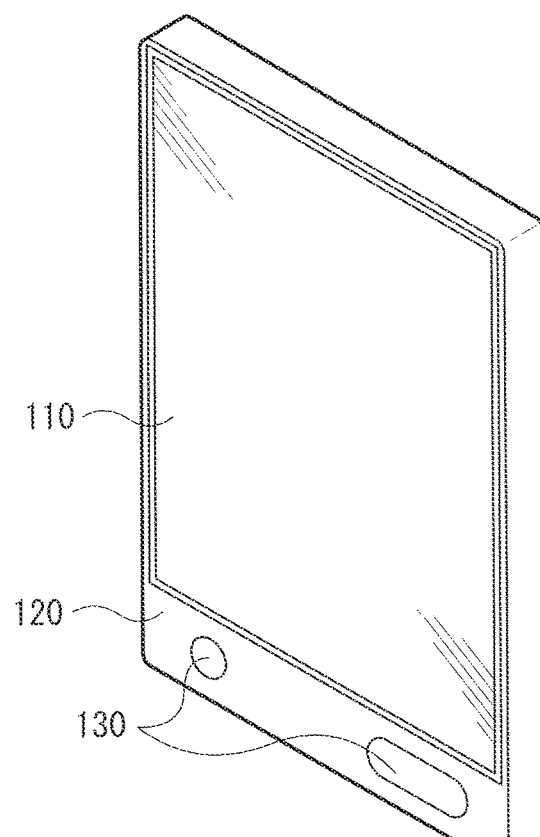
Figure 11B:
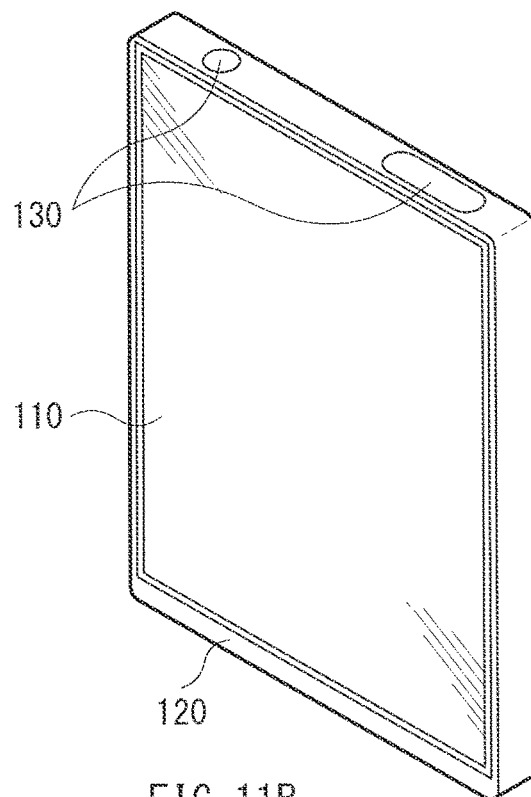
FIG. 11B is a perspective view illustrating another example of the appearance of the application example 1 illustrated in FIG. 11A.

FIG. 11A illustrates an example of an appearance of a smartphone, and FIG. 11B illustrates another example of an appearance of a smartphone. For example, the smartphone may include a display section 110 (the display unit 1 (or any of the display units 3 to 6)), a non-display section (a housing) 120, and an operation section 130. The operation section 130 may be provided on a front surface of the non-display section 120 as illustrated in FIG. 11A, or may be provided on a top surface as illustrated in FIG. 11B.

Application Example 2

Figure 12:
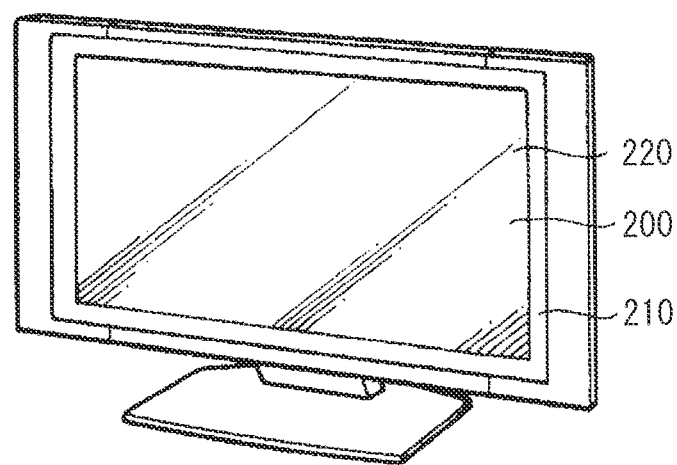
FIG. 12 is a perspective view illustrating an appearance of an application example 2.

FIG. 12 illustrates an appearance of a television receiver according to an application example 2. For example, the television receiver may have a picture display screen section 200 that includes a front panel 210 and a filter glass 220, and the picture display screen section 200 corresponds to any of the above-described display units 1 and 3 to 6.

Application Example 3

Figure 13A:
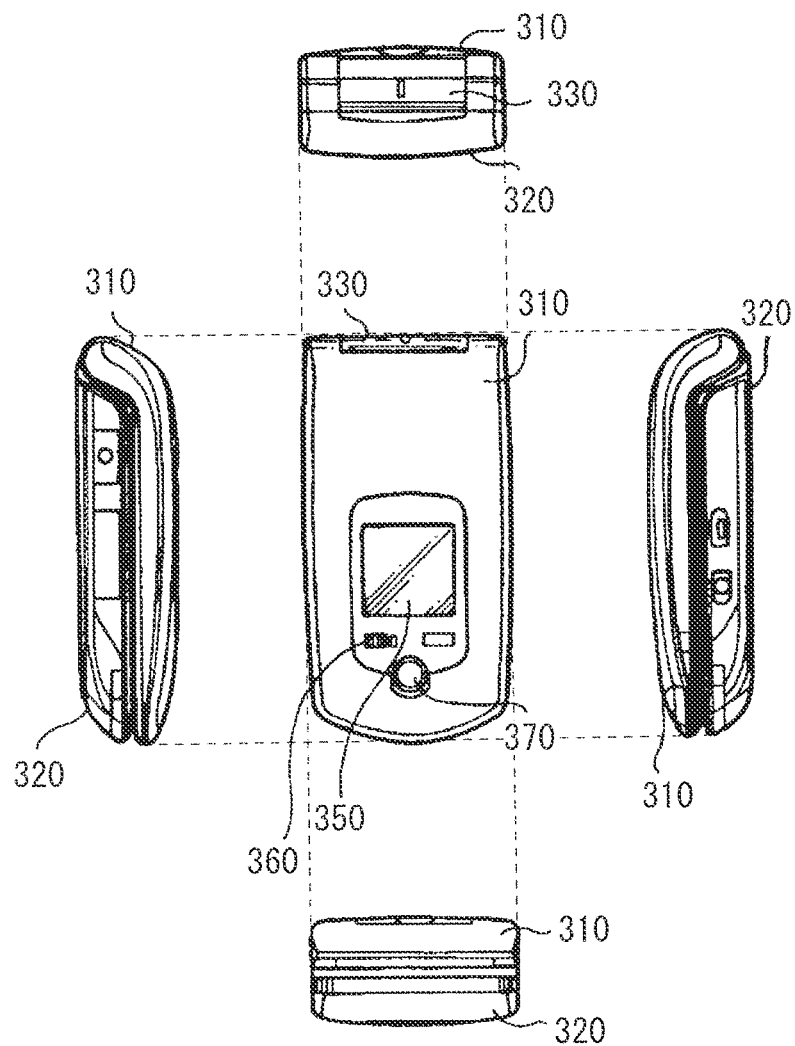
FIG. 13A is a front view, a left side view, a right side view, a top view, and a bottom view of an application example 3 in a closed state.
Figure 13B:
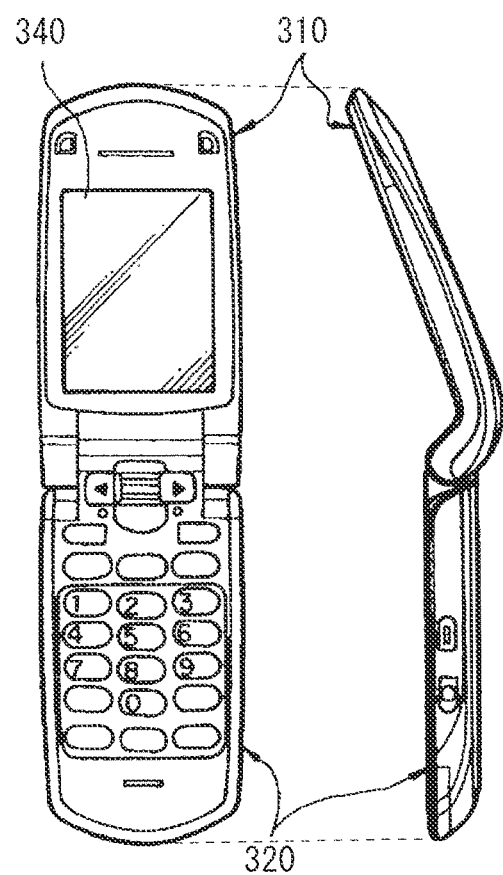
FIG. 13B is a front view and a side view of the application example 3 illustrated in FIG. 13A in an open state.

FIG. 13A is a front view, a left side view, a right side view, a top view, and a bottom view of a mobile phone according to an application example 3 in a closed state. FIG. 13B is a front view and a side view of the mobile phone in an open state. For example, the mobile phone may be configured by connecting an upper housing 310 and a lower housing 320 with a connecting section (a hinge section) 330, and may include a display 340, a sub-display 350, a picture light 360, and a camera 370. The display 340 or the sub-display 350 corresponds to any of the above-described display units 1 and 3 to 6.

Hereinbefore, although the technology has been described with referring to the first to third embodiments and the modifications, the technology is not limited to the above-described embodiments and the like, and various modifications may be made. For example, the materials and the thickness of the respective layers, the film formation method, the film formation condition, and the like that are described in the above-described embodiments and the like are not limited thereto, and other materials and other thicknesses may be be used, and other film formation methods and formation conditions may be used.

Further, each of the layers described in the above-described embodiments and the like is not necessarily provided, and may be appropriately omitted. Moreover, a layer other than the layers descried in the above-described embodiments and the like may be added. Furthermore, the display unit provided with the three color pixels of the red pixel 2R, the green pixel 2G, and the blue pixel 2B as the color pixels has been described as an example in the above-described embodiments and the like. However, a white pixel or a yellow pixel may be combined with these three color pixels.

Moreover, in the above-described embodiments and the like, the configuration in which the light emitting elements 10R, 10G, and 10B emit single color light corresponding to the pixels 2R, 2G, and 2B, respectively has been employed. However, a configuration of emitting white light may be employed. Further, although the organic EL element has been described as the light emitting element 10 in the above-described embodiments and the like, an inorganic EL element, a semiconductor layer, a light emitting diode (an LED), and the like may be used.

Incidentally, the effects described in the present specification are merely examples without limitation, and other effects may be obtainable.

Note that the technology may be configured as follows.
(1) A display unit including:
a drive substrate having a plurality of pixels with a partition therebetween; and
a first light shielding film provided on the partition.
(2) The display unit according to (1), wherein
each of the pixels includes a light emitting layer, and has an organic layer that is at least partially provided as a layer common to the plurality of pixels, and
the first light shielding film is provided between the partition and the organic layer.
(3) The display unit according to (1) or (2), wherein
the partition has a flat top surface and an inclined side surface, and
the first light shielding film is provided on the flat top surface of the partition.
(4) The display unit according to (1) or (2), wherein
the partition has a flat top surface and an inclined side surface, and
the first light shielding film is provided on the flat top surface and the inclined side surface.
(5) The display unit according to any one of (1) to (4), further including
a black matrix provided on a counter substrate side and having an opening at a position corresponding to the pixel, the counter substrate being disposed to face the drive substrate, wherein the first light shielding film has an end surface on a pixel side rather than an end surface of the opening of the black matrix as viewed from a display surface.
(6) The display unit according to (5), further including
a second light shielding film between the first light shielding film and the black matrix.
(7) The display unit according to any one of (1) to (6), wherein the first light shielding film has light absorbing property.
(8) The display unit according to (7), wherein the first light shielding film is formed of carbon (C), chromium oxide ($Cr_2O_3$), and an alloy of samarium (Sm) and silver (Ag), or an organic material.
(9) The display unit according to any one of (1) to (8), wherein the first light shielding film has light reflectivity.
(10) The display unit according to (9), wherein the first light shielding film contains one or more of aluminum (Al), chromium (Cr), gold (Au), platinum (Pt), nickel (Ni), copper (Cu), tungsten (W), and silver (Ag).
(11) The display unit according to any one of (1) to (10), wherein light emitted from the light emitting layer is different by pixels.
(12) The display unit according to any one of (1) to (10), wherein light emitted from the light emitting layer is white light.
(13) An electronic apparatus provided with a display unit, the display unit including:
a drive circuit having a plurality of pixels with a partition therebetween; and
a first light shielding film provided on the partition.

It should be understood by those skilled in the art that various modifications, combinations, sub-combinations, and alterations may occur depending on design requirements and other factors insofar as they are within the scope of the appended claims or the equivalents thereof.

What is claimed is:
1. A display device comprising:
a plurality of light emitting elements including a first light emitting element and a second light emitting element, wherein the first light emitting element includes a first anode electrode, a first portion of a cathode electrode layer, and a first portion of an organic layer, and the second light emitting element includes a second anode electrode, a second portion of the cathode electrode layer, and a second portion of the organic layer;
a partition disposed between the first anode electrode and the second anode electrode;
a first light shielding film arranged between the first light emitting element and the second light emitting element in a cross-sectional view;
a second light shielding film arranged between the first light emitting element and the second light emitting element in the cross-sectional view; and
a plurality of color filters including a first color filter corresponding to the first light emitting element and a second color filter corresponding to the second light emitting element, wherein
the first color filter and the second color filter respectively overlap with the first light shielding film and the second light shielding film in the cross-sectional view,
the first light shielding film and the second light shielding film are disposed at a light emission side of the display device,
the first light shielding film overlaps with the second light shielding film in the cross-sectional view,
the first light shielding film overlaps with the first anode electrode in the cross-sectional view, the second light shielding film overlaps with the first anode electrode in the cross-sectional view, and the first light shielding film is disposed between the cathode electrode layer and the second light shielding film in the cross-sectional view.

2. The display device according to claim 1, wherein the first light shielding film includes a conductive material.

3. The display device according to claim 1, further comprising:

a substrate configured to seal the light emitting elements, wherein the first light shielding film is disposed between the substrate and the cathode electrode layer in the cross-sectional view.

4. The display device according to claim 1, wherein a width of the partition is longer than a width of the first light shielding film in a first direction, and the first direction is parallel to a bottom surface of the first light shielding film.

5. The display device according to claim 4, wherein the width of the partition is longer than a width of the second light shielding film in the first direction.

6. The display device according to claim 1, further comprising:

a plurality of color filters including a first color filter corresponding to the first light emitting element and a second color filter corresponding to the second light emitting element.

7. The display device according to claim 6, wherein an edge portion of the first color filter overlaps with the first light shielding film in the cross-sectional view, and an edge portion of the second color filter overlaps with the second light shielding film in the cross-sectional view.

8. The display device according to claim 1, wherein the first portion of the organic layer and the second portion of the organic layer are a continuous same layer.

9. An electronic apparatus comprising the display device according to claim 1.

10. The electronic apparatus according to claim 9, wherein the first light shielding film includes a conductive material.

11. The electronic apparatus according to claim 9, further comprising:

a substrate configured to seal the light emitting elements, wherein the first light shielding film is disposed between the substrate and the cathode electrode layer in the cross-sectional view.

12. The electronic apparatus according to claim 9, wherein a width of the partition is longer than a width of the first light shielding film in a first direction, and the first direction is parallel to a bottom surface of the first light shielding film.

13. The electronic apparatus according to claim 12, wherein the width of the partition is longer than a width of the second light shielding film in the first direction.

14. The electronic apparatus according to claim 10, further comprising:

a plurality of color filters including a first color filter corresponding to the first light emitting element and a second color filter corresponding to the second light emitting element.

15. The electronic apparatus according to claim 14, wherein an edge portion of the first color filter overlaps with the first light shielding film in the cross-sectional view, and an edge portion of the second color filter overlaps with the second light shielding film in the cross-sectional view.

16. The electronic apparatus according to claim 9, wherein the first portion of the organic layer and the second portion of the organic layer are a continuous same layer.

* * * * *